United States Patent [19]

Müller

[11] Patent Number: 5,570,073
[45] Date of Patent: Oct. 29, 1996

[54] NMR SLICE COIL

[75] Inventor: Wolfgang Müller, Karlsruhe, Germany

[73] Assignee: Bruker Analytische Messtechnik GmbH, Rheinstetten, Germany

[21] Appl. No.: 421,071

[22] Filed: Apr. 13, 1995

[30] Foreign Application Priority Data

Jul. 13, 1994 [DE] Germany ............ 44 24 580.7

[51] Int. Cl.$^6$ ............ H01F 7/22; H01F 7/06
[52] U.S. Cl. ............ 335/299; 324/319; 324/320; 335/216
[58] Field of Search ............ 335/216, 299, 335/301; 324/318, 319, 320

[56] References Cited

U.S. PATENT DOCUMENTS

| | | | |
|---|---|---|---|
| 4,564,812 | 1/1986 | Van Dijk | 324/309 |
| 4,613,820 | 9/1986 | Edelstein et al. | |
| 4,701,736 | 10/1987 | McDougall et al. | 335/299 |
| 4,710,741 | 12/1987 | McGinley | 335/296 |
| 5,162,768 | 11/1992 | McDougall et al. | 335/296 |
| 5,194,810 | 3/1993 | Breneman et al. | 324/319 |
| 5,309,106 | 5/1994 | Miyajima et al. | 324/318 |
| 5,400,786 | 3/1995 | Allis | 128/653.2 |
| 5,412,363 | 5/1995 | Breneman et al. | 335/216 |

FOREIGN PATENT DOCUMENTS

| | | |
|---|---|---|
| 0160350 | 11/1985 | European Pat. Off. . |
| 0460762 | 12/1991 | European Pat. Off. . |
| 0619500 | 10/1994 | European Pat. Off. . |
| 3333755 | 4/1985 | Germany . |
| 562824 | 3/1993 | Japan . |

Primary Examiner—Brian W. Brown
Assistant Examiner—Raymond M. Barrera

[57] ABSTRACT

A magnet system for a nuclear spin tomograph having at least one field producing magnet coil $S_1$ with radius $r_{s1}$ arranged in a middle plane which produces a homogeneous magnetic field in an investigational volume directed along a z-axis perpendicular to the middle plane, is characterized in that at least one, preferentially at least two, ferromagnetic rings $R_i$ with radius $r_{Ri}$ are provided in the middle plane concentric to the magnetic coil $S_1$. A system of this kind can be substantially more compact in construction than conventional systems with equal produced field strength. In addition substantially reduced currents are required through the coil or coils for field production.

5 Claims, 11 Drawing Sheets

NMR SLICE COIL

BACKGROUND OF THE INVENTION

The invention concerns a magnet system for a nuclear spin tomograph with at least one field producing magnet coil $S_1$ located in a middle plane and having a radius $r_{s1}$ which produces a homogeneous magnetic field along a z-axis directed perpendicular to the middle plane.

A magnet system of this kind is known in the art from EP 0 160 350 B1.

In this publication slice-shaped configurations of magnet coils are described for the production of a homogeneous magnetic field for NMR tomography. These slice-shaped coils comprise ring-shaped concentrically nested partial coils which have currents flowing through them in opposite radially alternating directions. In this fashion these types of coils can be utilized to produce an NMR magnetic field with the necessary homogeneity in the vicinity of the center of the investigational volume.

An advantage of this type of slice-shaped magnetic coils is that very good access to the investigational volume axially as well as diagonally from the side or from above is facilitated. In this fashion, for example, an examining physician can treat portions of the body of a patient located in the investigational volume during an examination of the patient. In particular the possibility is thereby provided for carrying out minimally invasive surgery, whereby the treating physician can utilize NMR images during the operation for at least partial orientation assistance inside the body of the patient. In an ideal case monitoring of the operation is possible using the produced NMR images.

A similarly structured slice-shaped magnetic coil configuration for field production in NMR tomography is known in the art from WO 90/05369. This configuration likewise contains concentric individual coils arranged in the middle plane having differing radii, whereby pole plates made from ferromagnetic material are provided for at axial separations from the slice-shaped coil configuration symmetrically with respect to the middle plane which are attached to an iron housing surrounding the slice-shaped configuration so that a largely closed magnetic flux of the magnetic field produced in the slice-shaped coil configuration is achieved. The pole plates are intended to largely balance out the forces in the wall due to the magnetic flux.

In a configuration of this type it is not, however, possible to achieve a homogeneity volume in the center of the slice-shaped coil configuration, rather two volume regions of high magnetic field homogeneity are produced on each side of the middle plane of the configuration at an axial separation before or behind the slice. Due to the metal plates which block access in the axial direction in this known H-magnet configuration this system offers neither good access in the axial direction nor diagonally from the side or from above to the geometrical center of the configuration.

The magnet system known in the art from U.S. Pat. No. 5,117,188 which also exhibits a slice-shaped coil configuration also fails to offer double-sided axial or sideward diagonal access to the center of the configuration which, in this case, also contains the volume of greatest homogeneity. In this configuration in which the z-axis runs vertically, an asymmetric ferromagnetic plate is provided for below the ring-shaped coil having an axial separation from the middle plane of the coil configuration upon which, for example, a patient being examined can lie. With the assistance of the asymmetrically shaped ferromagnetic plate, the magnetic field within the investigational volume is strengthened and rendered locally homogeneous.

Although the above mentioned EP 0 160 350 B1 describes a slice-shaped magnet coil configuration with which the axial and radially diagonal access to the investigational volume is relatively large, the magnet system known in the art exhibits, however, the disadvantage that, due to the alternating current directions of the partial coils of the slice-shaped configuration, the magnetic field strengths produced in the investigational volume are relatively low despite higher individual currents, since the produced partial fields largely cancel each other. In order to achieve a sufficiently high magnetic field strength with likewise high field homogeneity in the investigational region, it is necessary for these types of systems to be relatively large. In addition, with resistive systems, a very high electrical power for the magnetic field construction is required which leads to a heating of the coils or to cooling problems at high field strengths. Finally, the space requirements for a system of this type are relatively high.

It is therefore the object of the present invention to present a magnet system of the above mentioned kind which, on the one hand, facilitates good access to the investigational volume in the axial direction from the front and at least diagonally from the side and which, on the other hand, can be constructed in a relatively compact fashion for comparable produced magnetic field strengths or which produces a magnetic field with substantially higher field strength compared to magnetic systems with comparable ampere winding numbers and field homogeneity in a comparably large investigational volume.

SUMMARY OF THE INVENTION

This purpose is achieved in accordance with the invention in a surprisingly simple but effective fashion in that at least one ferromagnetic ring $R_1$ of radius $r_{R1}$ is provided for in the middle plane concentric to the magnetic coil $S_1$. A ferromagnetic ring of this type can be geometrically configured in such a fashion that it can replace a second magnetic coil having a current flowing in the opposite direction compared to the first magnetic coil $S_1$ to render the produced magnetic field within the investigational volume homogeneous. In this fashion the complete electrical power of the electric current fed through the magnetic coil $S_1$ is utilized for production of the magnetic field in the investigational volume so that the magnet system can have a much more compact construction with substantially less electrical power and equal field strength.

An embodiment of the magnet system in accordance with the invention is particularly preferred with which at least two magnet coils $S_i$ are provided for which are arranged largely concentrically and which are connected electrically in such a fashion that they have current flowing through them during operation in the same direction. Due to the second and to each additional magnet coil the entire system provides for additional degrees of freedom so that, with this type of configuration, a particularly high homogeneity of the produced magnetic field can be achieved in the investigational volume. Theoretically a field homogeneity of up to eighth order can be achieved even with the utilization of two magnet coils. With i >2 is therefore possible to produce magnetic fields with even higher orders of homogeneity.

In addition or alternatively, in another particularly preferred embodiment of the magnet system in accordance with the invention, at least two ferromagnetic rings $R_i$ with radii $r_{Ri}$ are provided for which are arranged in the middle plane largely concentric to the magnetic coil $S_1$. The providing for additional magnetic rings gives the magnetic system additional degrees of freedom for rendering the produced magnetic field homogeneous. In particular in connection with the above described embodiment having a plurality of magnetic coils $S_i$ which have currents flowing through them in a common direction, magnetic fields of very high field strength can be produced in the investigational volume with extremely high homogeneity.

An embodiment is also advantageous with which the magnetic coils $S_i$ are surrounded by a ferromagnetic yoke. In this case, the outer stray fields produced by the magnetic coil can be kept relatively small and, on the other hand, the investigational volume in which the produced magnetic field must be particularly homogeneous, is shielded against external disturbing fields. In addition, by means of a concentrated return of the magnetic flux in the shielding, an increase in the magnetic field strength in the investigational volume is effected.

When the magnetic coils $S_i$ utilized are resistive, no complicated cryosystem is necessary for the entire configuration. Such a magnet system is particularly economical to produce when small field strengths are desired. Since, in producing comparable magnetic field strengths with the magnet system in accordance with the invention, a substantially lower electric power is required compared to magnetic systems known in the art, the requirements for cooling of the system are likewise substantially lower.

Alternatively thereto in another preferred embodiment, the magnetic coils $S_i$ can be superconducting and can be located within a croystat (possibly together with the ferromagnetic rings $R_i$). Particularly high magnetic field strengths can be produced in a magnet system of this kind whereby, in contrast to resistive systems, continuous addition of electrical energy for the production of the field is not necessary, at least in the superconducting persistent current mode.

An embodiment of the magnet system in accordance with the invention is particularly compact with which the magnet coils $S_i$ are wound onto coil supports and the rings $R_i$ are at least partially integrated into the coil supports. In this fashion it is possible for the coil carriers to be made completely or partially than ferromagnetic material and to satisfy the above defined geometric conditions for the rings $R_i$.

A further embodiment of the magnet system in accordance with the invention has a Faraday shielding for high-frequency fields which is at least partially integrated into the iron shielding in order to keep the entire configuration as compact as possible.

An embodiment is particularly preferred with which the ferromagnetic rings $R_i$ are permanent magnets. In this fashion the same field strength in the investigational volume can be produced with smaller ring cross sectional surfaces than with incompletely saturated soft magnetic rings.

It is preferred when the rings and, if appropriate, the shield exhibit as small an electrical conductivity as possible in order to prevent a built-up of eddy currents during switching of magnetic field gradients and to thereby prevent disturbances in the field homogeneity produced thereby.

In particular, with an improvement of this embodiment the rings and, if appropriate, the shield are slotted, laminated or, for example, produced from a powered material. In a symmetric embodiment which is therefore particular simple to produce, the ferromagnetic rings of the magnet system in accordance with the invention are circular rings.

In this fashion as high a homogeneity of the static magnetic field in the investigational volume as possible is produced.

An embodiment is particularly appropriate, for example, for mammography applications in which both breasts are to be simultaneously investigated with which the ferromagnetic rings $R_i$ and the magnetic coils $S_i$ have an elliptical or approximately rectangular form.

The strength of the homogeneous static magnetic field which can be produced preferentially assumes a value of approximately 0.1 Tesla to 0.4 Tesla (corresponding to a proton frequency between 5 MHz to 15 MHz). In this field strength region the power savings, in particular when utilizing resistive magnet coils, is particularly high. When producing higher magnetic field strengths the ferromagnetic rings can become magnetically saturated which leads to a non-linear dependence and to complications in the rendering of the magnetic field in the investigational volume homogeneous.

An embodiment of the magnet system in accordance with the invention is particularly preferred with which an investigational volume having a diameter >0.2 m and a magnetic field homogeneity <$10^{31\ 4}$ is achieved so that sufficiently highly resolved slice images of the measuring object or of the patient being examined can be achieved within a particularly large investigational region.

The magnet system in accordance with the invention can be constructed in such a fashion that it can be operated with differing magnetic field strengths. In this fashion, with the same configuration, differing nuclear resonance frequencies can be excited. At other operational frequencies it is possible, for example, to achieve a more advantageous power consumption of the main magnet and/or an improved contrast dependence for the produced images.

Further advantages of the invention can be derived from the description and the accompanying drawings. The above mentioned features as well as those to be described further below in accordance with the invention can be utilized individually or collectively in arbitrary combination. The embodiments shown are not to be considered as exhaustive enumeration rather have exemplary character only.

The invention is represented in the drawing and will be more closely described and explained with reference to concrete embodiments.

DESCRIPTION OF THE PREFERRED EMBODIMENT

The magnetic resonance imaging magnet system in accordance with the invention for the production of a static magnetic field directed along a z-axis perpendicular to the middle plane of the system, whose homogeneity in the investigational volume is better than $10^{-4}$, comprises at least one field producing magnet coil $S_1$ arranged in the middle plane of the magnet system and having radius $r_{s1}$ as well as at least one ferromagnetic ring $R_1$ in the middle plane concentric to the magnet coil $S_1$ and having radius $r_{R1}$. In the simplest case, in this manner, the same magnetic field homogeneity can be achieved in the investigational volume as is accomplished with a conventional two coil system with which both magnet coils are concentric to another in the middle plane of the magnet system and have opposite currents flowing through them.

Figure 1:
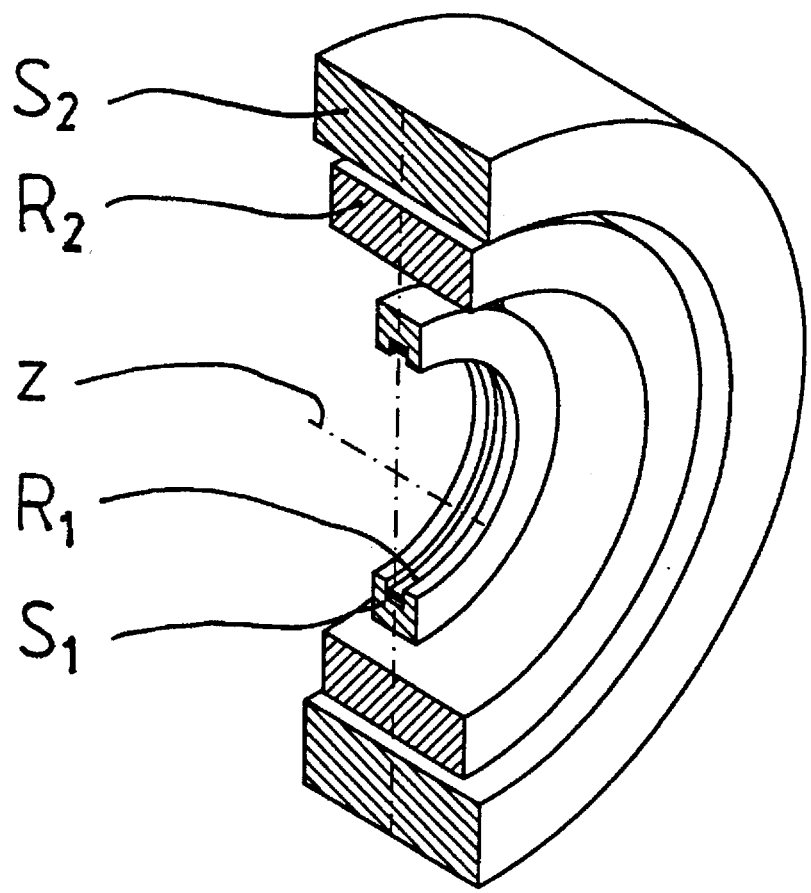
FIG. 1 shows a schematic perspective representation of a magnet system in accordance with the invention vertically cut along the z-axis (corresponds to magnet 2 in the table)

A half of an embodiment of the magnet system in accordance with the invention is shown in FIG. 1 with which, in addition to the first field producing magnet coil $S_1$ and to the first ferromagnetic ring $R_1$ which is integrated in the coil S1, an additional ferromagnetic ring $R_2$ as well as an additional field producing magnet coil $S_2$ are provided for concentrically thereto in the middle plane. Both magnet coils $S_1$ and $S_2$ are electrically connected in such a fashion that current flows through them during operation in the same direction and, in this manner, they contribute commonly in an additive fashion to a homogeneous static magnetic field in the investigational volume above the center of the configuration.

Figure 2:
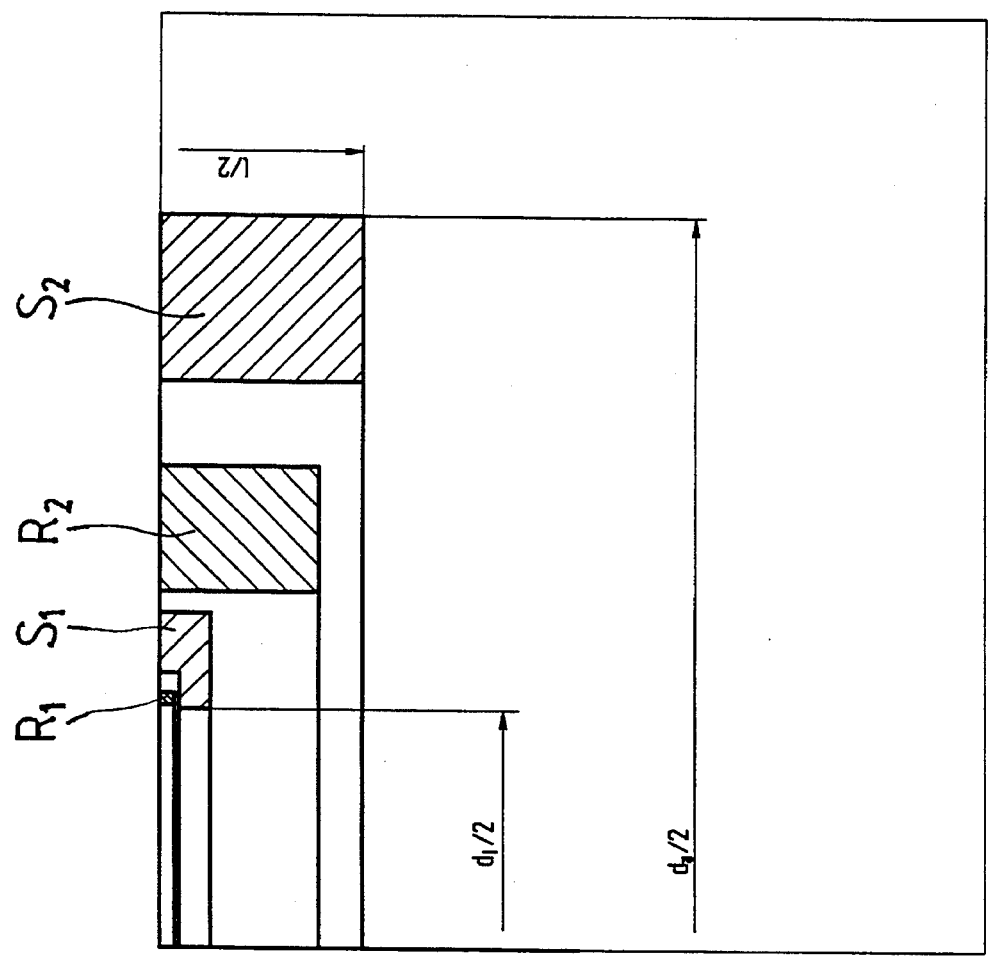
FIG. 2 shows a schematic cut through the middle plane in one quadrant of a magnet system in accordance with the invention (corresponds to magnet 2 in the table)

FIG. 2 shows a schematic longitudinal cut in the direction of the z-axis through one quadrant of the magnet system according to FIG. 1. As is the case with FIGS. 3, 4 and 7 the cut representation of FIG. 2 is to scale so that, in addition to the explicitly shown quantities for inner diameter $d_i$, the outer diameter $d_a$ and the length 1 of the magnet system, the magnitudes and positions of the elements utilized (magnet coils $S_i$, rings $R_i$) can likewise be extracted in each case. Since, in FIG. 2 as in the described FIGS. 3, 4 and 7 one is dealing in each case with a horizontal cut through one quadrant of the system containing the z-axis, only the quantities $d_i/2$, $d_a/2$ and ½ are shown.

Not shown in the drawing are, however, advantageous embodiments of the magnet system in accordance with the invention with which only one single magnet coil $S_1$ together with two ferromagnetic rings $R_1$, $R_2$ or two magnet coils $S_1$, $S_2$ with only one ferromagnetic ring $R_1$ are utilized. Both systems can certainly produce a static magnetic field which achieves a homogeneity of eighth order in the investigational volume. The first variation, having only one coil, has the advantage that it is particularly inexpensive to produce since the price of the entire configuration depends largely on the price of the magnet coil or coils utilized.

On the other hand, with other embodiments of the magnet system in accordance with the invention also more than two magnet coils $S_i$ and/or more than two ferromagnetic rings $R_i$ can be utilized, which is likewise not shown in the drawing. These types of system have the advantage that more parameters are available for optimizing the field homogeneity in the investigational volume to thereby achieve a homogeneity which is even higher than eighth order.

Figure 3:
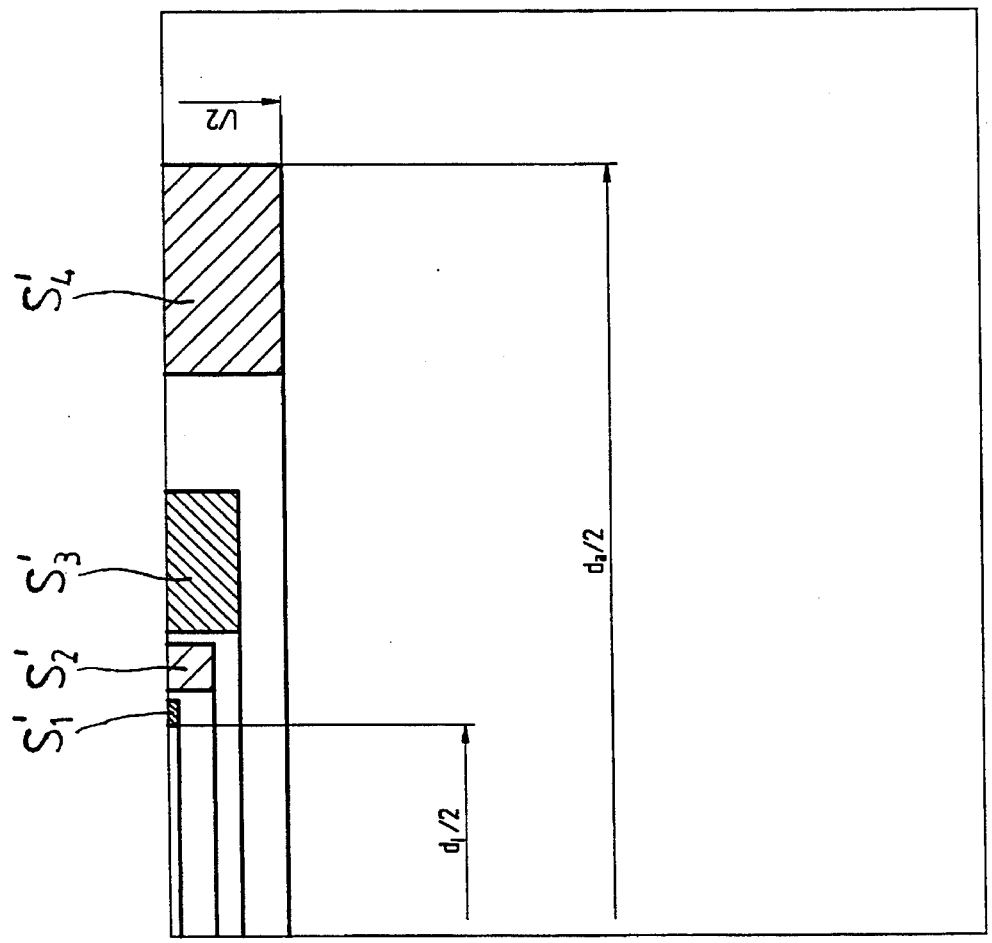
FIG. 3 shows a cut through the middle plane in one quadrant of a magnet system in according with prior art (corresponds to magnet 1 in the table)

FIG. 3 shows a similar representation as FIG. 2 of a cut through the middle plane in one quadrant of a magnet system for nuclear resonance imaging, whereby the magnet system of FIG. 3 is that of prior art. It does not contain ferromagnetic rings $R_i$ as is the case in the magnet system in accordance with the invention, rather magnet coils $S_i$' which are supplied with current whose direction in the individual coils alternates in radial sequence. In the magnet system represented the currents flow in the same direction through coils $S_1$' and $S_3$', whereas the currents through the coils $S_2$' and $S_4$' are directed oppositely thereto. In this fashion, although it is likewise possible to achieve a field of high homogeneity in the investigational volume as is the case with the magnet system in accordance with the invention, this is done at the expense of the magnetic field strength, since coils with oppositely directed currents mutually weaken the magnetic fields produced thereby. In this manner a substantially greater amount of electrical power is utilized for the production of a particular field strength in the investigational volume using resistive coils than with the magnet system in accordance with the invention with which the magnet coils $S_i$ have current flowing through them during operation in the same direction.

The utilization of an iron shield to shield the outward magnetic field produced by the apparatus as well as to shield the investigational volume against external interference is particularly advantageous, whereby, for constant electrical power in a resistive coil system, a higher magnetic field strength in the investigational volume is achieved as an additional positive effect when utilizing an iron shield of this type.

Figure 4:
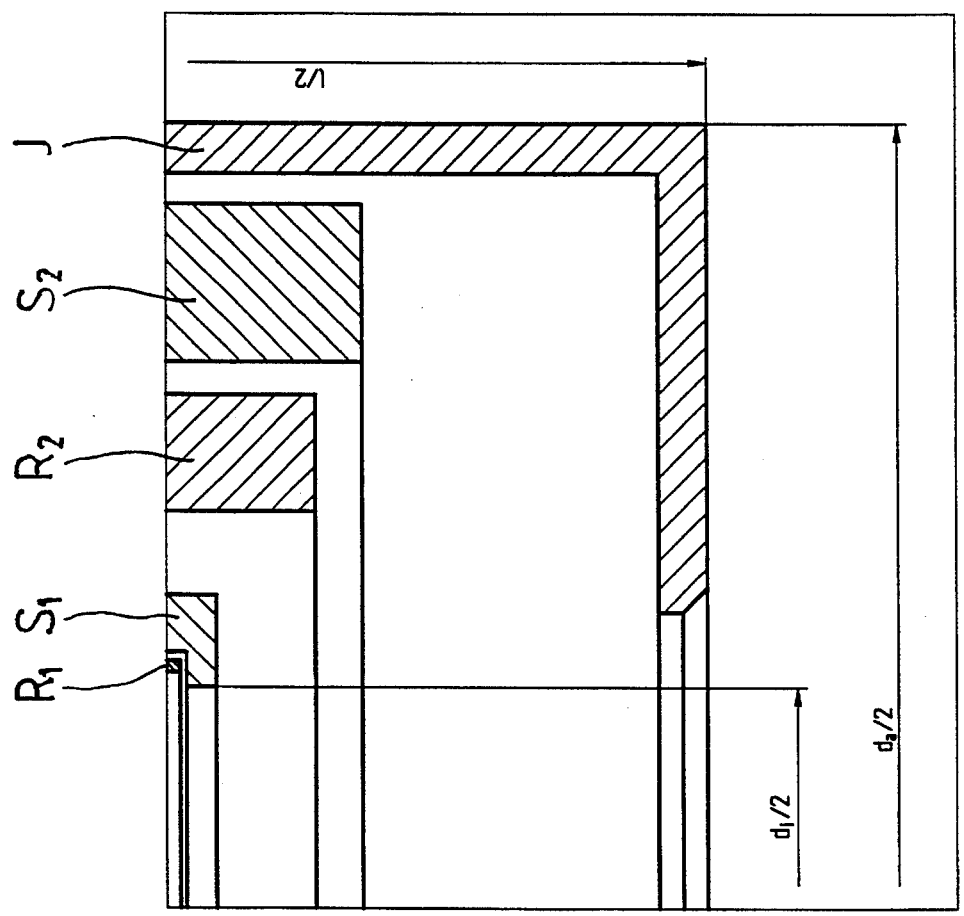
FIG. 4 shows a cut through a middle plane in one quadrant of another embodiment of the magnet system in accordance with the invention (corresponds to magnet 3 in the table)

FIG. 4 shows a cut through the middle plane of a quadrant of an embodiment of the magnet system in accordance with the invention which is very similar to that shown in FIG. 2, whereby here an additional shielding in the form of a ferromagnetic yoke J is provided for around the magnet system.

Figure 5:
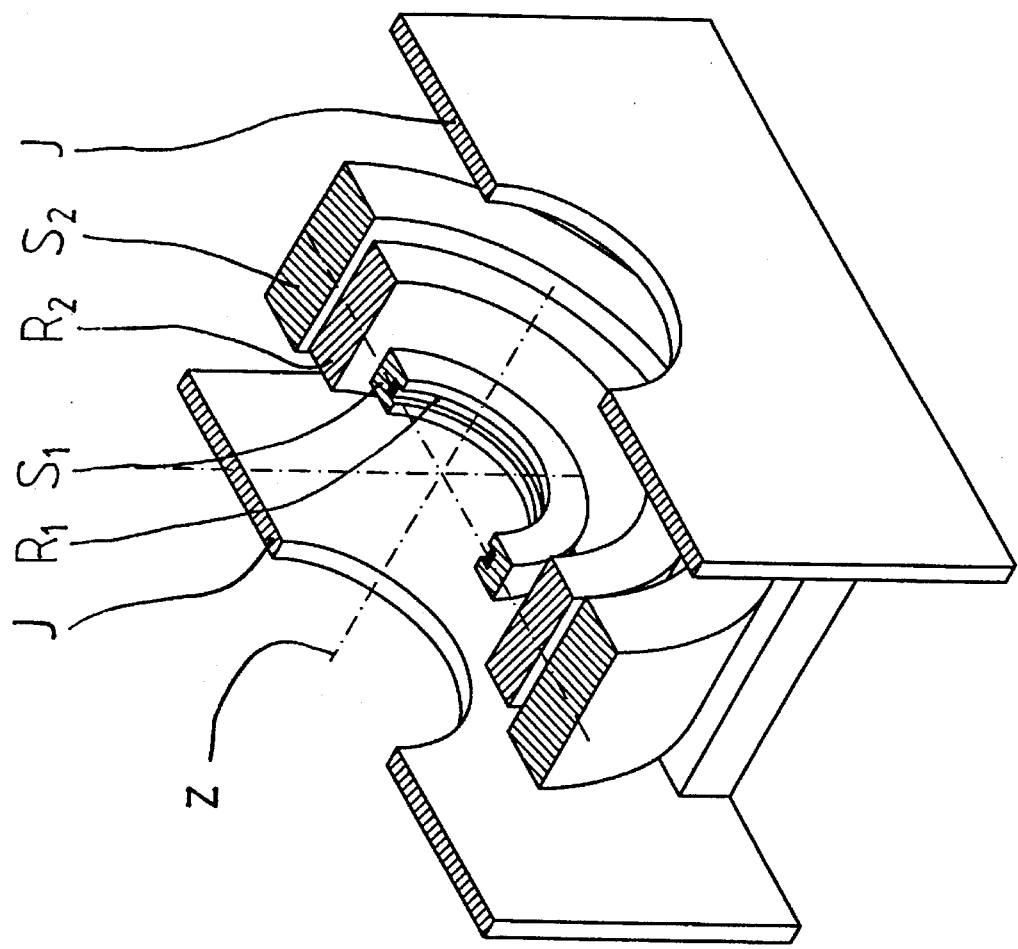
FIG. 5 shows a schematic perspective representation of the lower halves of the magnet system in accordance with FIG. 4 (corresponds to magnet 3 in the table) after a horizontal cut along the z-axis.

The lower spatial half of the magnet system of FIG. 4 is shown in FIG. 5, whereby the direction of view is diagonally from above onto the horizontal cut plane surface between the two system halves. With this type of iron shielding which runs around the z-axis and completely surrounds the magnet system shown except for the axial access holes, it is possible to nearly zero the magnetic stray fields in the outer region during operation of the magnet coils.

Figure 6:
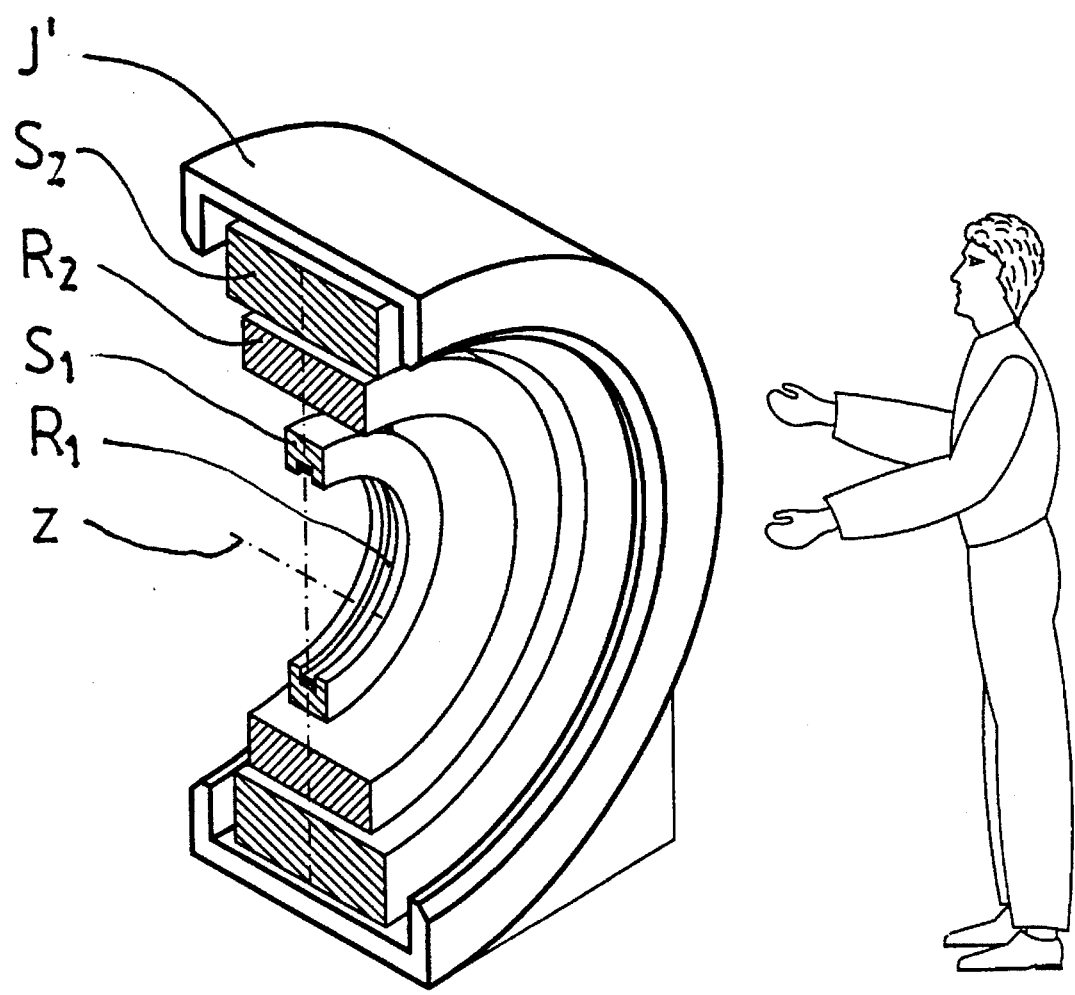
FIG. 6 shows a schematic perspective representation of the right half of a preferred embodiment of the magnet system in accordance with the invention (corresponds to magnet 4 in the table) following a vertical cut along the z-axis.

A somewhat reduced shielding effect is present in the iron shielding J' in the embodiment of the magnet system in accordance with the invention shown in FIG. 6 in a spatial cut representation. However the configuration is significantly more compact and only minimally hinders the axial access to the investigational volume as well as the access diagonally from the side. The shielding by means of the iron joke J' is, in this embodiment, fashioned quite close to the main coil system. For purposes of size comparison an appropriately scaled operator is shown in FIG. 6 next to the magnet system of the invention.

Figure 7:
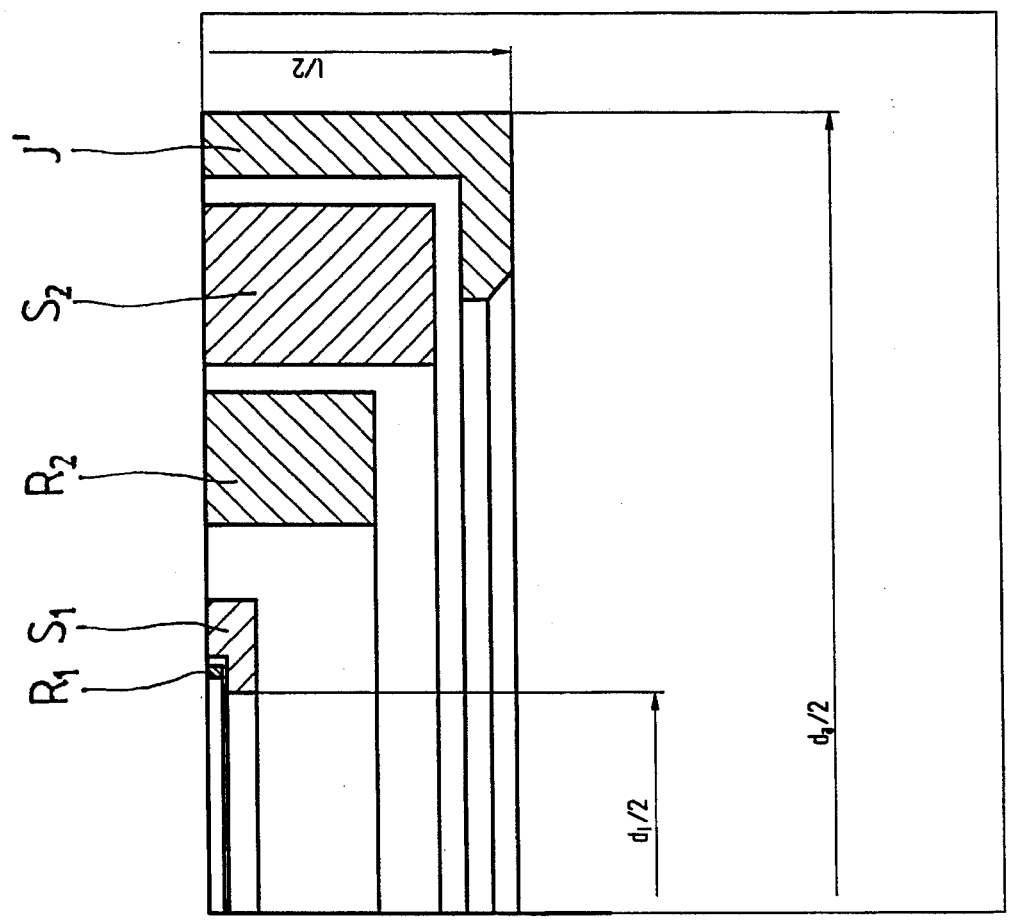
FIG. 7 shows a schematic cut through the middle plane in one quadrant of a magnet system in accordance with FIG. 6 (corresponds to magnet 4 in the table)

FIG. 7 shows a cut through the middle plane of one quadrant of the embodiment shown in FIG. 6 of the magnet system in accordance with the invention. The precise dimensioning of this embodiment can also be extracted from the drawing.

Figure 8:
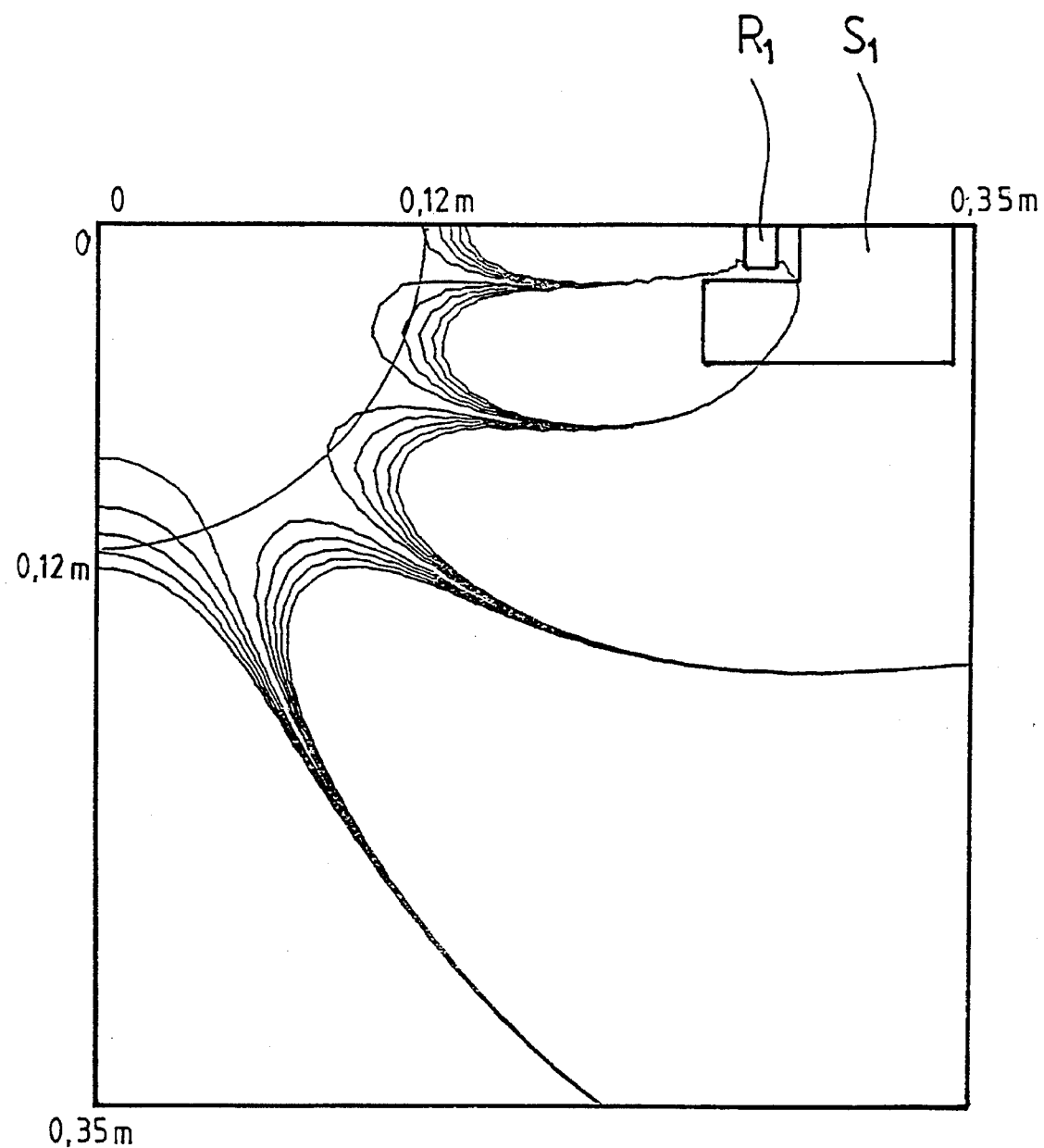
FIG. 8 shows a calculated diagram of lines of equal field strength deviation ±100 ppm of an eighth order homogeneous magnetic field in one quadrant of the investigational region of the magnet system according to FIG. 7.

FIG. 8 shows a calculated diagram of lines of equal field deviation (lines with ±100 ppm deviation are emphasized) in a plane perpendicular to the z-axis, whereby the left upper corner of the figure is coincident with the center investigational volume of the embodiment of the magnet system in accordance with the invention schematically shown in FIG. 7. The side lengths of the calculated representation correspond, in reality, to 0.35 m in each case. Four "radiation beams" are visible in the diagram of FIG. 8 which indicates a system of eighth order in field homogeneity.

Figure 9:
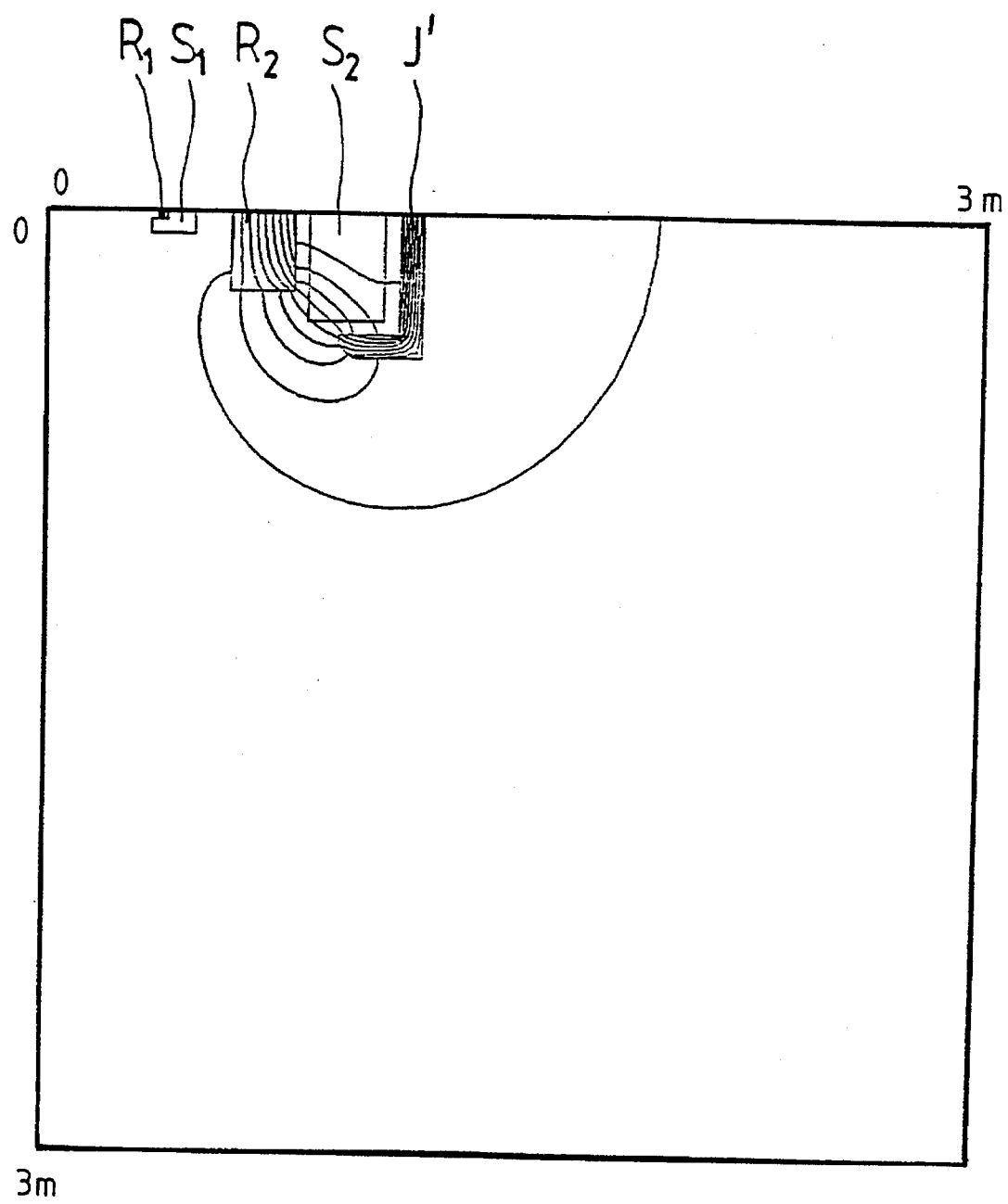
FIG. 9 shows a schematic cut representation similar to FIG. 7, but reduced in size and having magnetic field lines.

The diagram of FIG. 9 contains the same quadrants of the embodiments of the magnet system in accordance with the invention shown in FIG. 7, whereby the elements of the magnet system are shown compared to the representation in FIG. 7 in a somewhat reduced scale.

FIG. 9 also shows the dependence of the magnetic field lines when current is flowing through the coils $S1$, $S_2$ at the outer regions of the magnet systems. In particular one notices a concentration of magnetic field lines in the ferromagnetic rings $R_2$ and in the shielding iron yoke J' which shows a corresponding concentration of the magnetic flux through the elements mentioned.

Figure 10:
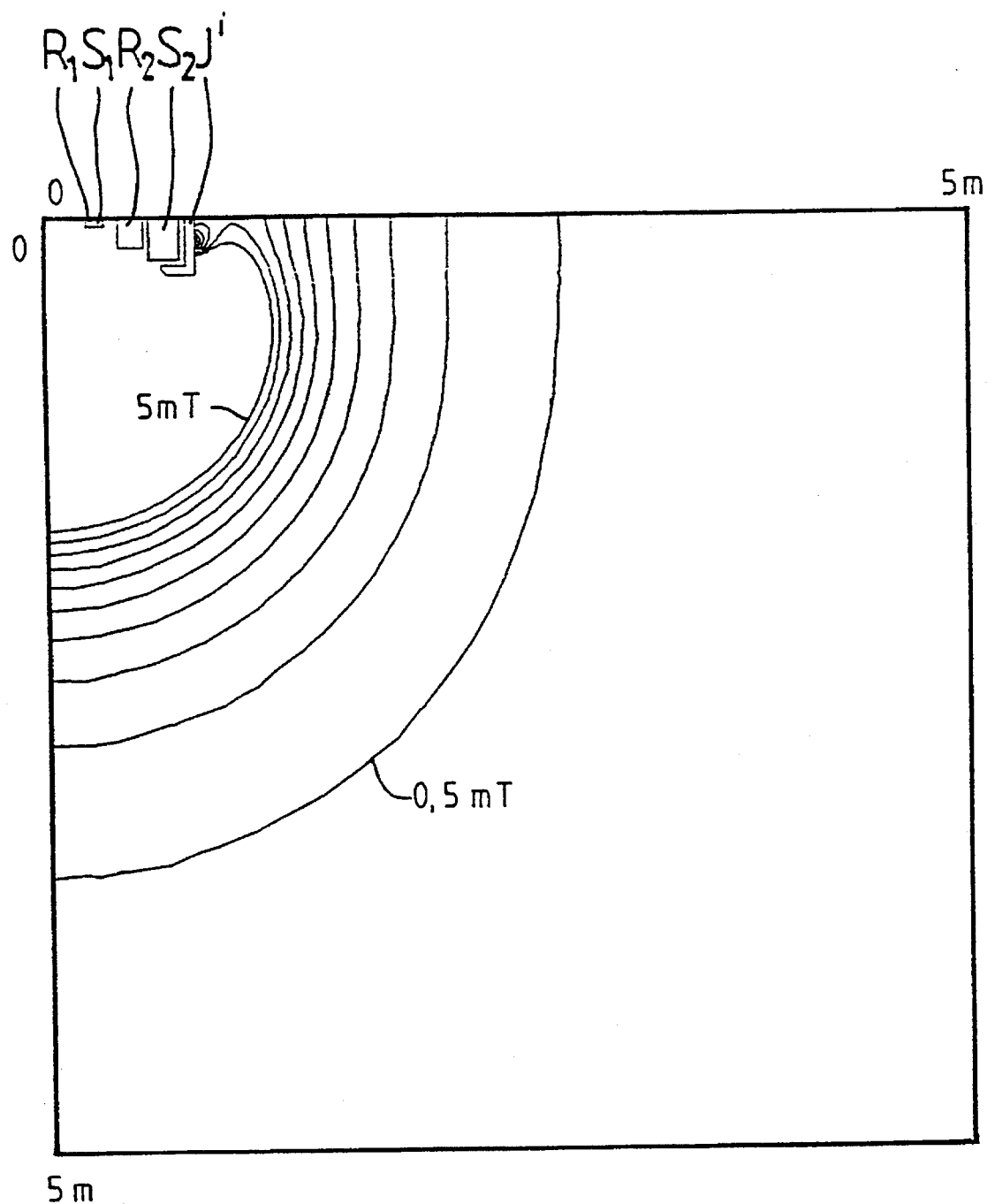
FIG. 10 shows a schematic representation as in FIG. 9, but reduced in sized and having lines of like field strength in the outer region (stray field)

The diagram of FIG. 10 contains, for its part, a cut through the middle plane in one quadrant of the embodiment of the magnet system in accordance with the invention shown in FIG. 7, whereby the individual elements are represented in reduced scale compared to FIG. 9. The dependence of lines of like magnetic field strength in the outer region (=stray fields) are also shown in FIG. 10 which are concentrated in the shielding iron yoke J'. The stray field lines are represented with decreasing strengths beginning with the 5mT line and up to the 0.5mT line.

Figure 11:
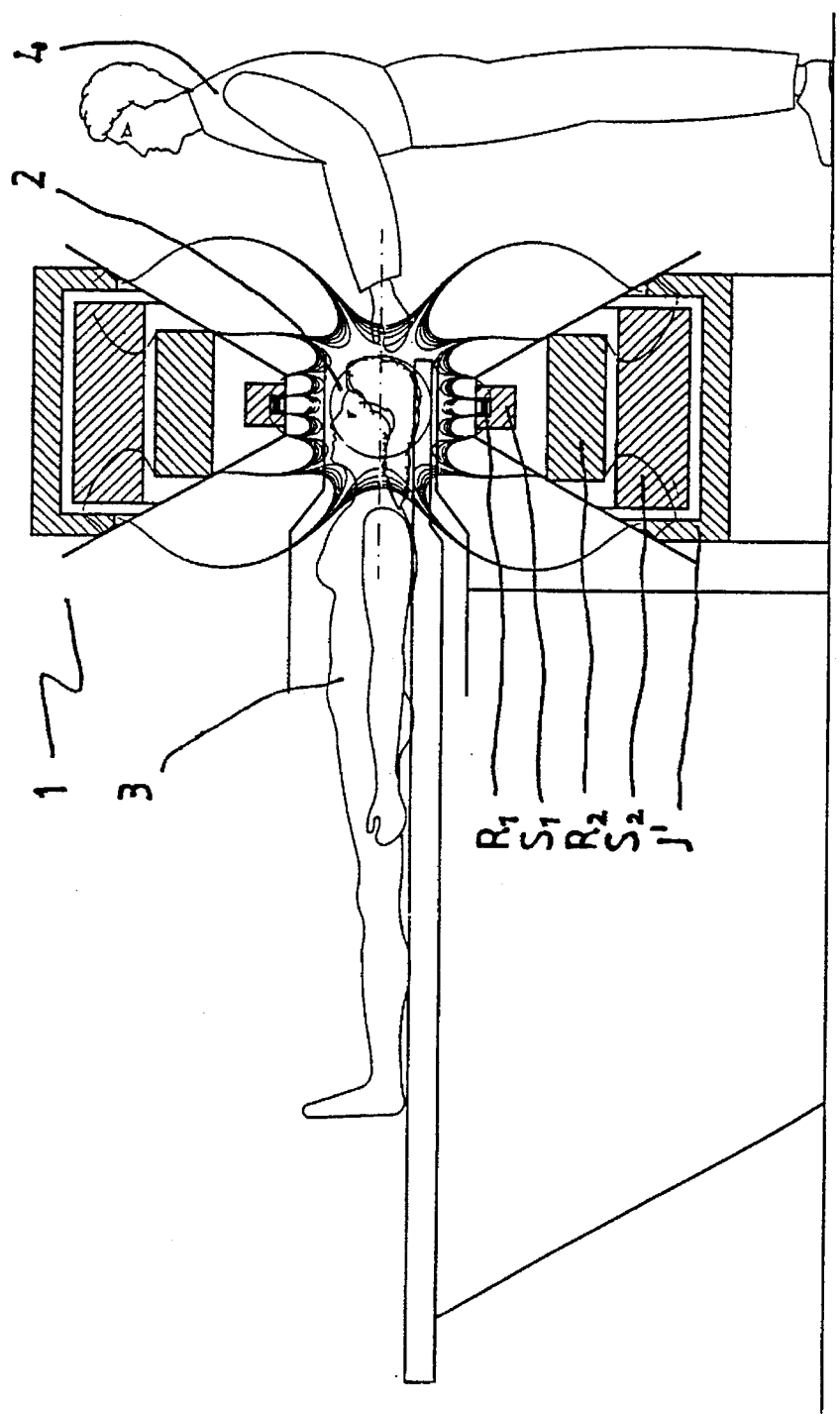
FIG. 11 shows a schematic vertical cut along the z-axis through a magnet system in accordance with the invention (corresponds to magnet 4 in the table) with indicated lines of equal field strength in the investigational region with examined patient and examining operator.

Finally, FIG. 11 shows a complete nuclear spin tomography installation in a schematic vertical cut along the z-axis with which the slice-shaped magnet system 1 in accordance with the invention is shown with a homogeneity region 2 in the investigational volume. A prone patient 3 is positioned in such a way that his head seats at the center of the magnet system 1. The installation also exhibits a gradient system and, if appropriate, a shielding for this gradient system.

One furthermore sees in the representation of FIG. 11 a standing operator 4 who has a comfortable access to the head region while examining the patient 3. The patient 3 is stationary relative to the imaging system so that a unique mapping between the spatial position and the tomographic images produced by the apparatus is possible.

Further details of possible embodiments of the invention are given below. The configuration of the magnet system in accordance with the invention, in particularly advantageous applications, admits of a series of possible configurations which include the following points:

By scaling it is possible to achieve a plurality of differing diameter relationships. In this fashion it is possible for the magnet system in accordance with the invention to be optimally adjusted to concrete boundary conditions.

The field producing and field determining elements can be configured in a conical fashion in such a manner that the free axial access to the investigational volume as well as diagonal access relative to the z-axis are optimized.

The magnet coils $S_i$ can either be resistive or contain superconducting material. In the latter case they are accommodated together with the ferromagnetic rings $R_i$ within a cryostat.

The magnetic coils $S_i$ can be wound onto coil supports in which the ferromagnetic rings $R_i$ are at least partially integrated.

It is possible for a Faraday shielding to be at least partially integrated into the iron shielding, effected in the above described embodiments by means of a ferromagnetic yoke J, J'.

The ferromagnetic rings $R_i$ can be permanent magnets.

In order to prevent the excitation of electrical eddy currents when switching gradient coils in the tomography configuration, which, in general, lead to large distortions of the magnetic field in the investigational volume, the ferromagnetic rings $R_i$ exhibit as small an electric conductivity as possible. In particular they can be slotted, laminated or pressed from powdered material.

The ferromagnetic rings $R_i$ as well as the magnet coils $S_i$ can, depending on the application, exhibit the shape of circular rings, elliptical rings or rectangular rings. This can, for example, be advantageous for mammography applications.

The magnetic field dependence of the homogeneity of the magnet system in accordance with the invention can be kept particularly small so that variations in the operating current strength do not effect the homogeneity, whereby the magnet can also be operated at differing magnetic field strengths.

A shim system can be utilized for rendering the system homogeneous whereby passive shims are particularly suited for the magnet system in accordance with the invention.

The flux return configuration can be effected in various ways by providing for an iron jacket, in particular in the shape of the above described magnetic yoke J, J'.

The table following the description gives a comparison between systems in calculated embodiments of the magnet system in accordance with the invention (magnets 2, 3 and 4 correspond to FIGS. 2, 4 and 7) to a magnet system according to prior art (magnet 1 corresponding to FIG. 3).

In conventional magnets 1 the magnet system consists of a total of four partial coils of which two have positive current flowing through them and two have negative current relative thereto during operation. Typically in a conventional magnet system of this kind, field strengths of about 0.05 T are achieved using resistive magnet coils.

Even the unshielded magnet 2 in the magnet system in accordance with the invention achieves, in contrast thereto, a field strength of 0.117 T with comparable electrical power consumption, whereby the inner diameter $d_i$ is substantially larger than with the magnet 1 which is known in the art so that a substantially better access to the investigational volume in the axial as well as diagonal to the z-axis directions is given. The weight of the copper in the magnet 2 in accordance with the invention is only increased insignificantly relative to the conventional magnet 1. For equal produced field strength the magnet 2 requires only approximately 18.2% the power of magnet 1.

In magnet 3, in contrast to magnet 2 a ferromagnetic yoke is provided for as a shielding which leads to a further increase in the magnetic field strength produced for equal electric power in the resistive system. In contrast to magnet 1, magnet 3 produces a magnetic field of approximately three and a half the times the field strength at approximately the same electrical power or, for equal produced magnetic field strengths, the power used by magnet 3 would be only 11% of that of magnet 1.

Finally magnet 4 is built similarly to magnet 3, however, the iron shielding is more compactly arranged about the coil and ferromagnetic rings. For this reason a somewhat reduced shielding effect occurs and the magnetic field produced in the investigational region is also somewhat weaker at constant electrical power. However, the magnet system of magnet 4 requires significantly less space.

An additional magnet configuration having the advantages in accordance with the invention results when the magnet coil $S_1$ of the magnet 4 is removed and a gap is introduced into the ring $R_2$ in the middle plane. Due to the gap in the ring $R_2$ a ring pair results which is arranged symmetrically about the middle plane. The system thereby comprises a magnetizing coil $S_2$, a ring pair and an inner ring $R_1$. A system of this kind likewise produces a homogeneous magnetic field of eighth order. An additional yoke shields the magnetic field and leads to a greater base field.

TABLE 1

| DIMS | Magnet 1 | Magnet 2 | Magnet 3 | Magnet 4 |
| --- | --- | --- | --- | --- |
| Magn. Field | 0,05 Tesla | 0,117 Tesla | 0,174 Tesla | 0,130 Tesla |
| Copper weight | 15 500 N | 16 700 N | 16 700 N | 16 500 N |
| Power | 32 KW | 33 KW | 33 KW | 33 KW |
| Field order | 8 | 8 | 8 | 8 |
| Inner diameter di | 420 mm | 460 mm | 450 mm | 450 mm |
| Outer diameter da | 1520 mm | 1420 mm | 1600 mm | 1600 mm |
| Length 1 | 232 mm | 400 mm | 1100 mm | 620 mm |

We claim:

1. A magnet system for producing, in an investigational volume, a homogeneous magnetic field directed along a z-axis, the system comprising:

a first field producing magnet coil located in a middle plane perpendicular to the z-axis, the middle plane passing through the investigational volume; a second field producing magnet coil, generally concentric and coplanar with the first magnet coil and electrically connected therewith to have a first current flow in the first magnet coil directed in a same direction as a second current flow through the second magnet coil; a first ferromagnetic ring generally concentric and coplanar with the first and second magnet coils; and a second ferromagnetic ring, generally concentric and coplanar with the first and second magnet coils and the first ferromagnetic ring.

2. A magnet system for producing, in an investigational volume, a homogeneous magnetic field directed along a z-axis, the system comprising:

a first field producing magnet coil located in a middle plane perpendicular to the z-axis, the middle plane passing through the investigational volume; a second field producing magnet coil, generally concentric and coplanar with the first magnet coil and electrically connected therewith to have a first current flow in the first magnet coil directed in a same direction as a second current flow through the second magnet coil; a first ferromagnetic ring generally concentric and coplanar with the first and second magnet coils; a second ferromagnetic ring, generally concentric and coplanar with the first and second magnet coils and the first ferromagnetic ring, wherein the first coil has a radius larger than a radius of the first ring, the second ring has a radius larger than the first coil radius and the second coil has a radius larger than the second ring radius; and a ferromagnetic yoke surrounding the first magnet coil.

3. A magnet system for producing, in an investigational volume, a homogeneous magnetic field directed along a z-axis, the system comprising:

a first field producing magnet coil located in a middle plane perpendicular to the z-axis, the middle plane passing through the investigational volume;

a second field producing magnet coil, generally concentric and coplanar with the first magnet coil and electrically connected therewith to have a first current flow in the first magnet coil directed in a same direction as a second current flow through the second magnet coil; and a first ferromagnetic ring generally concentric and coplanar with the first and second magnet coils, wherein the first magnet coil is a resistive magnet coil.

4. A magnet system for producing, in an investigational volume, a homogeneous magnetic field directed along a z-axis, the system comprising:

a first field producing magnet coil located in a middle plane perpendicular to the z-axis, the middle plane passing through the investigational volume;

a second field producing magnet coil, generally concentric and coplanar with the first magnet coil and electrically connected therewith to have a first current flow in the first magnet coil directed in a same direction as a second current flow through the second magnet coil; and a first ferromagnetic ring generally concentric and coplanar with the first and second magnet coils, wherein the first ferromagnetic ring is partially integrated into the first magnet coil.

5. A magnet system for producing, in an investigational volume, a homogeneous magnetic field directed along a z-axis, the system comprising:

a first field producing magnet coil located in a middle plane perpendicular to the z-axis, the middle plane passing through the investigational volume;

a second field producing magnet coil, generally concentric and coplanar with the first magnet coil and electrically connected therewith to have a first current flow in the first magnet coil directed in a same direction as a second current flow through the second magnet coil; and a first ferromagnetic ring generally concentric and coplanar with the first and second magnet coils, wherein the first ferromagnetic ring is permanent magnet.

* * * * *